(12) United States Patent
Hayashi et al.

(10) Patent No.: US 8,294,282 B2
(45) Date of Patent: Oct. 23, 2012

(54) SEMICONDUCTOR DEVICE AND ADHESIVE SHEET

(75) Inventors: Hidekazu Hayashi, Yokohama (JP); Hiroshi Tomita, Yokohama (JP); Junya Sagara, Kawasaki (JP); Shinya Takyu, Saitama-Ken (JP); Norihiro Togasaki, Yokohama (JP); Tetsuya Kurosawa, Yokohama (JP); Yukiko Kitajima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 296 days.

(21) Appl. No.: 12/730,007

(22) Filed: Mar. 23, 2010

(65) Prior Publication Data

US 2011/0068480 A1 Mar. 24, 2011

(30) Foreign Application Priority Data

Sep. 24, 2009 (JP) ................................ 2009-219339

(51) Int. Cl.
*H01L 23/48* (2006.01)
*H01L 23/52* (2006.01)
*H01L 29/40* (2006.01)
*H01L 23/28* (2006.01)
*H01L 23/22* (2006.01)

(52) U.S. Cl. ......... 257/777; 257/678; 257/783; 257/787

(58) Field of Classification Search .................. 257/777, 257/783, 787, 678, 686, 778, 788, 789, 791, 257/795

See application file for complete search history.

(56) References Cited

U.S. PATENT DOCUMENTS 6,747,348 B2 * 6/2004 Jeung et al. ............... 257/686

FOREIGN PATENT DOCUMENTS

| JP | 5-29323 | 2/1993 |
|---|---|---|
| JP | 5-82525 | 4/1993 |
| JP | 9-311468 | 12/1997 |
| JP | 10-7763 | 1/1998 |
| JP | 2004-200710 | 7/2004 |
| JP | 2005-36126 | 2/2005 |
| JP | 2005-228930 | 8/2005 |
| JP | 2006-216692 | 8/2006 |
| JP | 2008-522407 | 6/2008 |
| JP | 2009-49400 | 3/2009 |
| JP | 2009-81440 | 4/2009 |
| WO | WO 99/60070 | 11/1999 |
| WO | WO 2006/057940 A1 | 6/2006 |

OTHER PUBLICATIONS

Notification of Reasons for Rejection issued by the Japanese Patent Office on Jan. 31, 2012, for Japanese Patent Application No. 2009-219339, and English-language translation thereof.
First Notification of Reasons for Rejection issued by the Chinese Patent Office on Jun. 21, 2012, for Chinese Patent Application No. 201010135730.4, and English-language translation thereof.

* cited by examiner

*Primary Examiner* — Chuong A. Luu
(74) *Attorney, Agent, or Firm* — Finnegan, Henderson, Farabow, Garrett & Dunner, L.L.P.

(57) ABSTRACT

The present invention provides a semiconductor device which comprises a substrate, a first semiconductor chip on a substrate, a second semiconductor chip on the first semiconductor chip, and an adhesive sheet between the first and second semiconductor chips. The second semiconductor chip has a mirrored back surface, and the adhesive sheet contains a metal impurity ion trapping agent.

8 Claims, 3 Drawing Sheets

SEMICONDUCTOR DEVICE AND ADHESIVE SHEET

CROSS-REFERENCE TO RELATED APPLICATION

This application is based upon and claims the benefit of priority from prior Japanese Patent Application No. 2009-219339, filed on Sep. 24, 2009, the entire contents of which are incorporated herein by reference.

BACKGROUND OF THE INVENTION

1. Field of the Invention

The present invention relates to a semiconductor device using an adhesive sheet.

2. Background Art

Recently, in accordance with shrinking of a semiconductor device, contamination of a semiconductor device due to a minute amount of metal impurities is becoming a problem. In addition, as a semiconductor chip is rendered three-dimensional and a semiconductor device is highly integrated, reduction in film thickness of the semiconductor chip and adoption of a multilayer structure in the semiconductor chip are realized, whereby there have been increased requirements to more tightly control contamination in the production of the semiconductor device. Therefore, although a process for removing metal impurities is required to be provided, the provision of the process leads to reduction in productivity.

Some of the metal impurities, especially, metal ions such as Cu, Fe, Au, and Na that are movable ions with a high rate of diffusion in a wafer cause a problem. Those metal ions cause crystal defects in a semiconductor device region formed on the wafer, leading to deterioration of characteristics of a semiconductor device or an insulator film.

Thus, methods for removing those metal impurities from wafers have been proposed.

As one of the methods, there is a well-known method for cleaning a wafer with a mixed chemical solution of HCl (hydrochloric acid)-$H_2O_2$(hydrogen peroxide)-$H_2O$ (purified water) (the mixed chemical solution is referred to as Hydrochloric acid-Hydrogen Peroxide mixture (HPM) cleaning solution).

In the method for wet cleaning a wafer, metal impurities existing on a surface of the wafer can be removed. However, it is difficult to remove metal impurities existing inside the wafer by the method. In addition, naturally, this wet cleaning method requires many processes, facilities, and tightly contamination control. Namely, the wet cleaning method has a big problem in that enormous manufacturing cost is required.

Thus, as a method for removing metal impurities existing inside the wafer, a method referred to as a gettering method has been proposed. In this method, a region (referred to as a gettering site) in which metal impurities are trapped is formed on a wafer, and metal impurities are trapped in the region thereby prevent diffusion of the metal impurities in a semiconductor device region and so on, and a semiconductor device is prevented from being adversely affected by the metal impurities. More specifically, the gettering site is constituted of a set of a plurality of dangling-bonds. The dangling-bonds trap metal impurities. Thus, the gettering site is formed, for example, on the back surface region of a wafer or in the STI (Shallow Trench Isolation) region on the wafer those are regions distant from a semiconductor device region (a semiconductor active region) on a wafer so that even when dangling-bonds trap metal impurities, a semiconductor device and so on are not influenced.

The gettering method includes two main methods: an Extrinsic Gettering (EG) method and an Intrinsic Gettering (IG) method.

In the Extrinsic Gettering (EG) method, a plurality of dangling-bonds is formed on the back surface of a wafer to provide a gettering site. More specifically, the EG method is classified as follows by a method for forming a gettering site.

As a method for forming a generally used gettering site on the back surface of a wafer, there is a Back Side Damage (BSD) method. In this method, the back surface of a wafer is roughen thereby form a plurality of dangling-bonds on the back surface of the wafer, and, thus, to provide a gettering site (this method is disclosed by Japanese Patent Laid-Open No. 1993-29323, for example).

As another method, there is a Polysilicon Back Seal (PBS) method. In this method, a polysilicon film is laminated on the back surface of a wafer to thereby cause a distortion stress on the wafer, whereby a plurality of dangling-bonds are formed on the back surface of the wafer to provide a gettering site (this method is disclosed by Japanese Patent Laid-Open No. 2004-200710, for example).

As still another method, there is a phosphorus gettering method. Highly-concentrated phosphorus is injected into the back surface of a wafer to thereby form a plurality of dangling-bonds. According to this constitution, a gettering site is provided on the back surface of the wafer.

Meanwhile, in the Intrinsic Gettering method, a plurality of dangling-bonds are formed in a predetermined region in a wafer, for example, a STI (Shallow Trench Isolation) region on the wafer and a gettering site is provided. More specifically, in the Intrinsic Gettering method, the gettering site is formed as follows.

A minute amount of oxygen existing in a wafer is, for example, heated to be precipitated as oxide silicon (SiOx) in a predetermined region in the wafer. By virtue of the precipitation of oxide silicon, a plurality of dangling-bonds is formed in a predetermined region in the wafer to provide a gettering site (this constitution is disclosed by Japanese Patent Laid-Open No. 1993-82525, for example).

SUMMARY OF THE INVENTION

A semiconductor device according to an embodiment of the present invention comprising: a substrate; a first semiconductor chip on the substrate; a second semiconductor chip on the first semiconductor chip; the second semiconductor having a mirrored back surface; and an adhesive sheet between the first semiconductor chip and the second semiconductor chip, the adhesive sheet containing metal impurity ion trapping agent.

An adhesive sheet according to an embodiment of the present invention is between a first semiconductor chip in a semiconductor device and a second semiconductor chip on the first semiconductor chip, and comprises a metal impurity ion trapping agent.

DETAILED DESCRIPTION OF THE INVENTION

Figure 1:
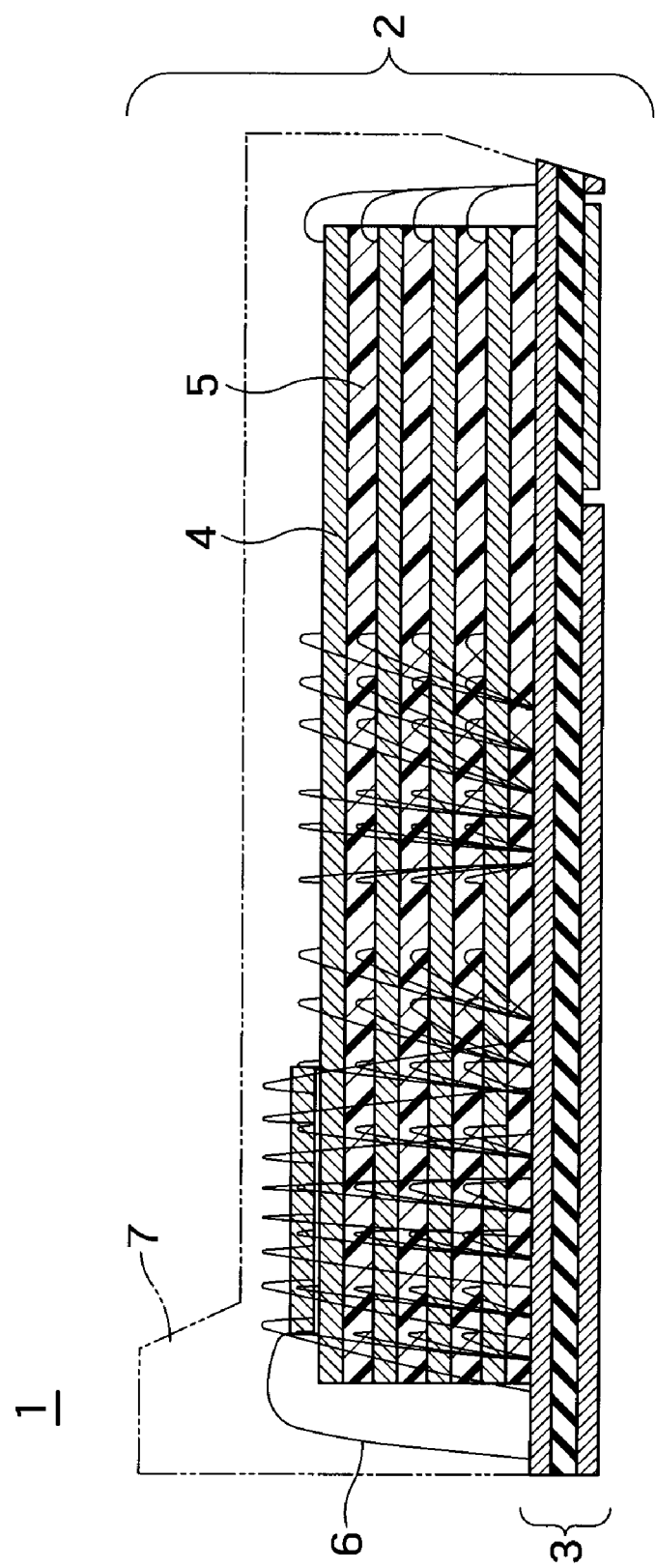
FIG. 1 is a cross-sectional view of a semiconductor device according to embodiments of the present invention.

The present inventor has considered that a semiconductor chip of the semiconductor device is further reduced in thickness to shrink the size of the semiconductor device. If the semiconductor chip is further reduced in thickness, the deflecting strength of the semiconductor chip is deteriorated, and thus the semiconductor chip becomes brittle.

Thus, the present inventor has considered that mirror polishing (for example, CMP and dry polishing) is applied to the back surface of the semiconductor chip so that the back surface is highly smooth polished, whereby a good deflecting strength of the semiconductor chip is realized while thinning the semiconductor chip.

When the above method is adopted, the present inventor conducted experiments to confirm the relationship between the surface condition of the back surface of a semiconductor chip and the deflecting strength. Hereinafter, the contents and the results of the experiment were described.

In this experiment, various treatments are applied to the back surface of each wafer with a thickness of 55 μm so that the wafers have different surface roughness. The roughness of the back surface of each obtained wafer and the deflecting strength are measured.

As a result, regarding the wafers having a roughly treated back surface, for example, the wafer with a roughness (Ra) of the back surface of 18.15 nm has a deflecting strength of 1.20 N, and the wafer with a roughness (Ra) of the back surface of 10.89 nm has a deflecting strength of 2.44 N. Namely, the wafers having a roughly treated back surface have a low deflecting strength value.

Meanwhile, regarding the wafers having a smooth back surface obtained by mirror polishing, for example, the wafer with a roughness (Ra) of the back surface of 0.54 nm has a deflecting strength of 3.37 N, and the wafer with a roughness (Ra) of the back surface of 0.30 nm has a deflecting strength of 3.49 N. Namely, the wafers having a smoothly treated back surface have a high deflecting strength value.

Based on the above result, it is found that as the back surface of a wafer is treated more smoothly, the deflecting strength is increased.

Thus, the present inventor applies mirror polishing to the back surface of a wafer to obtain a smooth back surface, whereby while a high deflecting strength of the wafer can be ensured, a semiconductor chip can be reduced in thickness.

According to this method, since a wafer is reduced in thickness by changing a method for treating the back surface of the wafer, this method can be utilized without significantly changing conventional semiconductor device producing method used by the present inventor.

Next, the present inventor measured electrical characteristics under various conditions with respect to a semiconductor device comprising a semiconductor chip having a back surface subjected to mirror polishing. Further, as a reference, a similar measurement is applied to conventional semiconductor device, that is, a semiconductor device comprising a semiconductor chip having a back surface not subjected to mirror polishing.

As a result, it is found that under a certain condition, the electrical characteristics of the semiconductor device comprising a semiconductor chip having a mirrored back surface is more deteriorated than the electrical characteristics of conventional semiconductor device.

The certain condition is referred to as a reliability test (an accelerated life test). In the test, it is confirmed that even if a semiconductor device as a product is used and stored for a predetermined amount of time, the electrical characteristics as the semiconductor device is maintained at a predetermined value.

More specifically, the predetermined amount of time is a period when the quality of a semiconductor device is warranted (for example, one year). Since a semiconductor device used for a predetermined amount of time cannot be obtained, it is virtually impossible to measure and confirm the electrical characteristics of the semiconductor device used for a predetermined amount of time. Thus, instead of the semiconductor device used and stored under normal conditions (for example, used and stored at 25 deg C.) for a predetermined amount of time, a semiconductor device is placed in a state of being under heavier load than the semiconductor device used and stored under normal conditions. More specifically, the semiconductor device is placed under extreme values of temperature and humidity conditions (for example, used and stored at 85 deg C.) for a shorter time than the predetermined amount of time, and the electrical characteristics of the semiconductor device are measured and confirmed.

Under the above conditions, the electrical characteristics of the semiconductor device comprising a semiconductor chip having a mirrored back surface is deteriorated compared with the electrical characteristics of conventional semiconductor device.

Thus, the present inventor thought of the causes as follows. Hereinafter, this were described using FIG. 2A.

Figure 2:
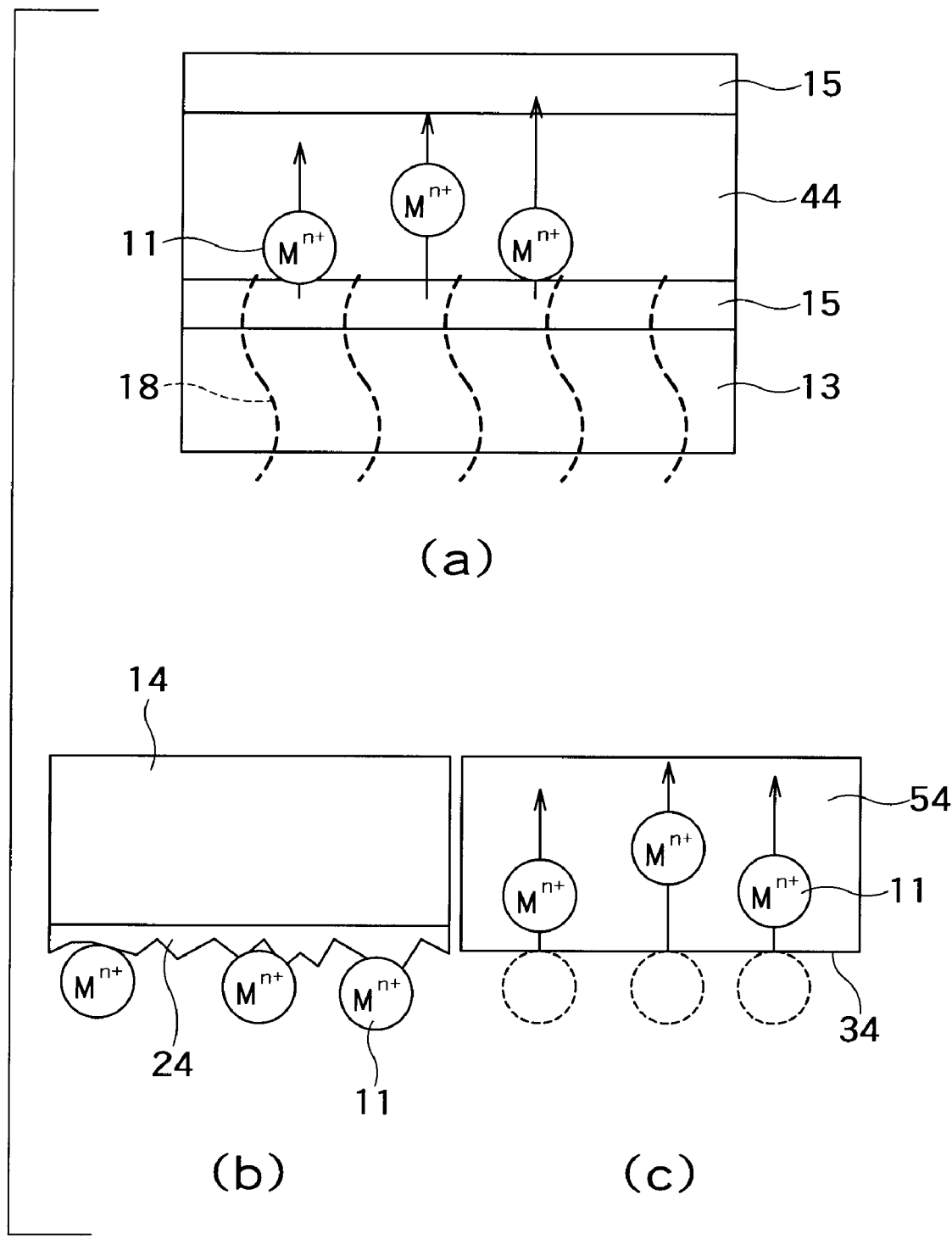
FIGS. 2A, 2B and 2C are views for describing the present invention and illustrating behaviors of metal impurity ions in the semiconductor device.

FIG. 2A illustrates behaviors of metal impurity ions in a semiconductor package.

In a process for producing a semiconductor device, before dicing for formation of semiconductor chips, a semiconductor wafer is lightly polished. At that time, metal impurities such as Cu, Fe, Au, Na, Ni, Co, Ti, and Ta are generated. Even after the semiconductor wafer is diced to form a plurality of semiconductor chips, a minute amount of metal impurities remains on the semiconductor chips.

While the minute amount of metal impurities remains on the semiconductor chip, the process proceeds to an assembly process (sealing process) for a semiconductor device. In the assembly process, the semiconductor chips are sealed in the semiconductor package to finally produce the semiconductor device.

As illustrated in FIG. 2A, heating treatment is performed during the assembly process, whereby a minute amount of water 18 in an atmosphere is absorbed into the semiconductor package, previously having a semiconductor chip 44 built-in, through a substrate 13 for a semiconductor package constituting the semiconductor package.

In the semiconductor package, by virtue of the absorbed water 18, the metal impurities remaining on the semiconductor chip 44 become metal impurity ions 11.

The metal impurity ions 11 move in the semiconductor package, more specifically, in the semiconductor chip 44 included in the semiconductor package and an adhesive sheet 15 (referred to as Die Attach Film: DAF) provided between a plurality of the semiconductor chips 44.

The metal impurity ions 11 eventually reach a semiconductor device region formed on the semiconductor chip to cause crystal defects and the like in the semiconductor device region, leading to an adverse effect on the semiconductor device. Consequently, it is considered that the electrical characteristics of the semiconductor device comprising a semiconductor chip having a mirrored back surface are deteriorated.

However, such behaviors of the metal impurities occur not only in the semiconductor device comprising a semiconductor chip having a back surface subjected to mirror polishing but also in conventional semiconductor device comprising a semiconductor chip having a back surface not subjected to mirror polishing.

Thus, the present inventor considered that the electrical characteristics of conventional semiconductor device was not deteriorated for the following reasons.

Hereinafter, the reasons were described using FIGS. 2B and 2C. FIG. 2B illustrates behaviors of metal impurity ions in a semiconductor chip of conventional semiconductor device having a back surface not subjected to mirror polishing. FIG. 2C illustrates behaviors of metal impurity ions in a semiconductor chip having a back surface subjected to mirror polishing.

As illustrated in FIG. 2B, a back surface 24 of a semiconductor chip 14 of conventional semiconductor device is not subjected to mirror polishing. In other words, the back surface 24 of the semiconductor chip 14 of conventional semiconductor device is rough. Thus, it is considered that, on the back surface 24 of the semiconductor chip 14 of conventional semiconductor device, although the gettering site is not intended to be formed, many dangling-bonds are provided in practice and exercise the functions as the gettering site. Therefore, it is considered that the metal impurity ions 11 are trapped on the back surface 24 of the semiconductor chip 14 of conventional semiconductor device, whereby the metal impurity ions 11 are prevented from reaching the semiconductor device region and leading to an adverse effect on the electrical characteristics of the semiconductor device. Consequently, it is considered that the electrical characteristics of the semiconductor device comprising a semiconductor chip having a back surface not subjected to mirror polishing are not deteriorated.

Meanwhile, as illustrated in FIG. 2C, in a semiconductor device comprising a semiconductor chip 54 having a mirrored back surface 34, since the back surface 34 of the semiconductor chip 54 is subjected to mirror polishing for the purpose of ensuring a high deflecting strength, the back surface 34 is smooth. Thus, since many dangling-bonds do not exist on the back surface 34 of the semiconductor chip 54, the back surface 34 does not function as the gettering site. Consequently, the metal impurity ions 11 which are not trapped on the back surface 34 of the semiconductor chip 54 reach the semiconductor device region thereby adversely affect the semiconductor device characteristics. Thus, it is considered that the electrical characteristics of the semiconductor device comprising a semiconductor chip having a back surface subjected to mirror polishing are deteriorated compared with the electrical characteristics of conventional semiconductor device comprising a semiconductor chip having a back surface not subjected to mirror polishing.

Based on the above thinking, the present inventor attempted to prevent the deterioration of the semiconductor device characteristics due to the metal impurity ions in the semiconductor device comprising a semiconductor chip having a mirrored back surface.

For this, although there can be considered various methods for preventing the deterioration of the semiconductor device characteristics due to the metal impurity ions, in order to prevent the occurrence of new problems, the present inventor wanted to adopt a method that can be utilized without changing conventional semiconductor device production method, that the present inventor has used, as possible.

Thus, the present inventor focused attention on an adhesive sheet (DAF), which is used when a semiconductor chip is stacked in a semiconductor package, and uniquely conceived of adding a function of capturing metal impurity ions to the adhesive sheet.

The adhesive sheet (DAF) is used for adhering overlapping semiconductor chips to each other or a semiconductor chip to a substrate for a semiconductor package when a plurality of semiconductor chips are stacked in the assembly process for a semiconductor package. For example, when a this adhesive sheet (DAF) with a thickness of not more than 50 µm is used, while avoiding significant increase of the thickness of a semiconductor device, the semiconductor chips or the semiconductor chip and the substrate for a semiconductor package can be uniformly and reliably adhered. Namely, the adhesive sheet is necessary for producing a compact semiconductor device.

The present inventor attempted to add a metal impurity ion trapping agent to the adhesive sheet (DAF) to thereby add the function of trapping the metal impurity ions to the adhesive sheet (DAF). In other words, the present inventor attempted to trap the metal impurity ions with the use of the adhesive sheet originally provided in the semiconductor device and prevent the semiconductor device characteristics from being deteriorated by the metal impurity ions.

According to this constitution, a compact semiconductor device can be realized while preventing the deterioration of the semiconductor device characteristics due to the metal impurities. Further, addition of production process and new facility investments are not required, and the conventional semiconductor device production method is not required to be changed.

The present invention was described in detail.

(Metal Impurity Ion Trapping Agent)

First, the metal impurity ion trapping agent added to the adhesive sheet (DAF) was described.

The metal impurity ion trapping agent is used for trapping the metal impurity ions. By the method for trapping the metal impurity ions, the metal impurity ion trapping agent is mainly classified into three categories: a chelating agent, an ion exchanger, and a metal powder.

Each size of those metal impurity ion trapping agent is preferably not more than 100 nm.

Hereinafter, those metal impurity ion trapping agents will be described.

(Chelating Agent)

First, the chelating agent was described.

The chelating agent has, in its molecular structure, at least one cyclic structure constituted of carbon atoms and comprises at least one OH group or O group bonded to the carbon atoms. The cyclic structure may be any of, for example, an alicyclic compound, an aromatic compound, and a heterocyclic compound. The examples of the chelating agent are shown as follows, but the present invention is not limited to them The chelating agent having the above structure has the property of bonding to metal ions to form a complex. By utilizing this property, the trapping of the metal impurity ions is attempted.

In the selection of those chelating agents, it should be considered to prevent not only increase in the cost but deterioration of a chemical stability in the adhesive sheet (DAF) and an adhesiveness of the adhesive sheet.

More specifically, as examples of the chelating agent, there are the following materials.

In the following examples, even when not specifically described, salts such as an ammonium salt and an alkali metal salt as the corresponding derivatives are included.

(1) Phenols Having Only One Oh Group and their Derivatives

Phenol, cresol, ethylphenol, t-butylphenol, salicylic acid, chlorophenol, aminophenol, aminocresol, amidol, p-(2- aminoethyl)phenol, o-salicylanilide, naphthol, naphtholsulfonic acid, 7-amino-4-hydroxy-2-naphthalensulfonic acid, and the like.

(2) Phenols Having Two or More Oh Groups and their Derivatives

Catechol, resorcinol, hydroquinone, 4-methylpyrocatechol,
2-methylhydroquinone, pyrogallol, 1,2,5-benzenetriol, 1,3,5-benzenetriol, 2-methylfluoroglucinol,
2,4,6-trimethylfluoroglucinol, 1,2,3,5-benzenetetraol, benzenehexanol, Tiron, aminoresorcinol,
2,4-dihydroxybenzaldehyde,
3,4-dihydroxybenzaldehyde, dihydroxyacetophenone,
3,4-dihydroxybenzoic acid, gallic acid,
2,3,4-trihydroxybenzoic acid,
2,4-dihydroxy-6-methylbenzoic acid, naphthalenediol, naphthalenetriol, nitronaphthol, naphthalenetetraol, binaphthyldiol, 4,5-dihydroxy-2,7-naphthalenedisulfonic acid,
1,8-dihydroxy-3,6-naphthalenedisulfonic acid,
1,2,3-anthracenetriol,
1,3,5-tris[((2,3-dihydroxybenzoyl)amino)methyl]benzene <MECAM>,
1,5,10-tris(2,3-dihydroxybenzoyl)-1,5,10-triazadecane <3,4-LICAM>, 1,5,9-tris(2,3-dihydroxybenzoyl)-1,5, 9-cyclotriazatridecane <3,3,4-CYCAM>,
1,3,5-tris[(2,3-dihydroxybenzoyl)carbamide]benzene <TRIM CAM>,
entecrobactin, enancycloenterobactin and the like.

(3) Hydroxybenzophenones
Dihydroxybenzophenone, 2,3,4-trihydroxybenzophenone,
2,6-dihydroxy-4-methoxybenzophenone,
2,2',5,6'-tetrahydroxybenzophenone,
2,3',4,4',6-pentahydroxybenzophenone, and the like.

(4) Hydroxybenzanilides
o-hydroxybenzanilide and the like.

(5) Hydroxyanils
Glyoxalbis(2-hydroxyanil) and the like.

(6) Hydroxybiphenyls
Biphenyltetraol and the like.

(7) Hydroxyquinones and their Derivatives
2,3-dihydroxy-1,4-naphthoquinone,
5-hydroxy-1,4-naphthoquinone, dihydroxyanthraquinone,
1,2-dihydroxy-3-(aminomethyl)anthraquinone-N,N'-diacetic acid <Alizarine complexane>, trihydroxyanthraquinone, and the like.

(8) Diphenyl- or Triphenyl-Alkane Derivatives
Diphenylmethane-2,2'-diol, 4,4',4''-triphenylmethanetriol,
4,4'-dihydroxyfuchsone, 4,4'-dihydroxy-3-methylfuchsone, Pyrocatechol Violet [PV], and the like.

(9) Phenol Derivatives of Alkylamines
Ethylenediaminediorthohydroxyphenylacetic acid <EDDHA>, N,N-bis(2-hydroxybenzyl)ethylenediamine-N,N-diacetic acid <HBED>, ethylenediaminedihydroxymethylphenylacetic acid <EDDHMA>, and the like.

(10) Phenol Derivatives of Alkylethers
3,3'-ethylenedioxydiphenol, and the like.

(11) Phenols Having an Azo Group and their Derivatives
4,4'-bis(3,4-dihydroxyphenylazo)-2,2'-stilbenedisulfonate-2-ammonium <Stilbazo>,
2,8-dihydroxy-1-(8-hydroxy-3,6-disulfo-1-naphthylazo)-3,6-naphthalenedisulfonic acid, o, o'-dihydroxyazobenzene,2-hydroxy-1-(2-hydroxy-5-methylphenylazo)-4-naphthalenesulfonic acid [calmagite], chlorohydroxyphenylazonaphthol,
1',2-dihydroxy-6-nitro-1,2'-azonaphthalene-4-sulfonic acid <Eriochrome Black T>,
2-hydroxy-1-(2-hydroxy-4-sulfo-1-naphthylazo)-3,6-naphthalenedisulfonic acid,
5-chloro-2-hydroxy-3-(2,4-dihydroxyphenylazo)benzene sulfonic acid <Lumogalion>,
2-hydroxy-1-(2-hydroxy-4-sulfo-1-naphthylazo)-3-naphth alic acid <NN>,
1,8-dihydroxy-2-(4-sulfophenylazo)-3,6-naphthalenedisulf onic acid,
1,8-dihydroxy-2,7-bis(5-chloro-2-hydroxy-3-sulfophenylaz o)-3,6-naphthalenedisulfonic acid,
1,8-dihydroxy-2,7-bis(2-sulfophenylazo)-3,6-naphthalenedisulfonic acid,
2-[3-(2,4-dimethylphenylaminocarboxy)-2-hydroxy-1-naphthylazo]-3-hydroxybenzenesulfonic acid,
2-[3-(2,4-dimethylphenylaminocarboxy)-2-hydroxy-1-naphthylazo]phenol, and the like.

(12) Heterocyclic Compounds Having an Oh Group and their Derivatives
8-quinolinol, 2-methyl-8-quinolinol, quinolinediol,
1-(2-pyridylazo)-2-naphthol, 2-amino-4,6,7-pteridinetriol,
5,7,3',4'-tetrahydroxyflavone<luteolin>,
3,3'-bis[N,N-bis(carboxymethyl)aminomethyl]fluorescein <calcein>,
2,3-hydroxypyridine, and the like.

(13) Alicyclic Compounds Having an Oh Group and their Derivatives
Cyclopentanol, croconic acid, cyclohexanol, cyclohexanediol,
dihydroxydiquinoyl, tropolone, 6-isopropyltropolone, tartaric acid, lactic acid, malic acid, citric acid, hydroxybutyric acid, triethanolamine, and the like.

(14) Monocarbonic Acids
Formic acid, acetic acid, propionic acid, butyric acid, isobutyric acid, valeric acid, decane acid, undecanoic acid, dodecanoic acid, stearic acid, acrylic acid, crotonic acid, oleic acid, monochloroacetic acid, dichloroacetic acid, trichloroacetic acid, fluoroacetic acid, benzoic acid, methylbenzoic acid, chlorobenzoic acid, sulfocarboxylic acid, phenylacetic acid, and the like.

(15) Polycarboxylic Acids
Oxalic acid, adipic acid, malonic acid, succinic acid, maleic acid, fumaric acid, 1,2,3-propanetricarboxylic acid, chlorosuccinic acid, phthalic acid,
1,3,5-benzenetricarboxylic acid, dichlorophthalic acid, phenylsuccinic acid, glutaric acid, pimelic acid, trimellitic acid, tricarballylic acid, and the like.

(16) Amino Acids
Asparagine acid, glutamic acid, and the like.

(17) Amino Polycarboxylic Acids
Ethylene diamine tetraacetic acid, trans-1,2-diaminocyclohexane tetraacetic acid, and the like.

(18) Amines
Ethylene diamine and the like.

(19) Phosphonic Acids
1-hydroxyethylidene-1,1'-diphosphonic acid and the like.

(20) Phosphoric Acids
Tripolyphosphoric acid, hexametaphosphoric acid, nitrotris (methylenephosphonic acid), and the like.

(21) Ketones and their Derivatives
Acetylacetone, hexafluoroacetylacetone, and the like.

(Inorganic Ion Exchanger)
An inorganic ion exchanger was described.
The inorganic ion exchanger traps ions and instead emits other ions possessed by the inorganic ion exchanger, whereby a part of the inorganic ion exchanger is exchanged. Namely, metal impurity ions are taken into the inorganic ion exchanger utilizing this property of the inorganic ion exchanger, whereby the metal impurity ions are trapped.

The inorganic ion exchanger has an excellent property in that it has a high performance of capturing metal ions. In addition, the inorganic ion exchanger is excellent in heat resistance and chemical resistance and less affects the adhesiveness of the adhesive sheet.

The examples of the inorganic ion exchanger having the above properties include a zirconium-based compound, an antimony-based compound, a bismuth-based compound, antimony-bismuth-based compound, a magnesium-aluminum-based compound, and the like, such as an oxide and a phosphate compound. More specifically, IEX series from Toagosei Co., Ltd. may be used, for example.

(Metal Powder)

Finally, the metal powder was described.

The metal powder as a metal impurity ion trapping agent traps the metal impurity ions using, as the gettering site described above, a plurality of dangling-bonds existing on the surface and so on of the metal powder.

Thus, the metal powder preferably has a rough surface. When the metal powder has a rough surface, many dangling-bonds exist on the surface of the metal powder, and therefore, the performance of trapping the metal impurity ions is increased in the metal powder.

If the surface of the metal powder is oxidized, the number of the dangling-bonds existing on the surface is reduced, whereby the performance of trapping the metal impurity ions of the metal powder is reduced. Thus, the metal powder is required to be handled with care so as to prevent the surface of the metal powder from being oxidized.

The metal powder has an excellent property in that it has a high heat resistance.

Further, the shape of the metal powder is not limited to a spherical shape, and it may be of a cubical crystal shape, for example. The average particle diameter of the metal powder is preferably smaller than the thickness of the adhesive sheet (DAF) to be described later, and the metal powder has such an average particle diameter that it does not cause deterioration of the adhesiveness of the adhesive sheet.

The examples of the above metal powder include a silicon powder. More specifically, for example, the silicon powder preferably has a silicon purity of not less than 99% so that the characteristics of a semiconductor device are not deteriorated by additional impurities. Particularly, an amorphous silicon or a polycrystalline silicon are used. Since the amorphous silicon has many dangling-bonds, it can trap the metal impurity ions more effectively. The polycrystalline silicon can trap the metal impurity ions at the crystal grain boundary.

Figure 3:
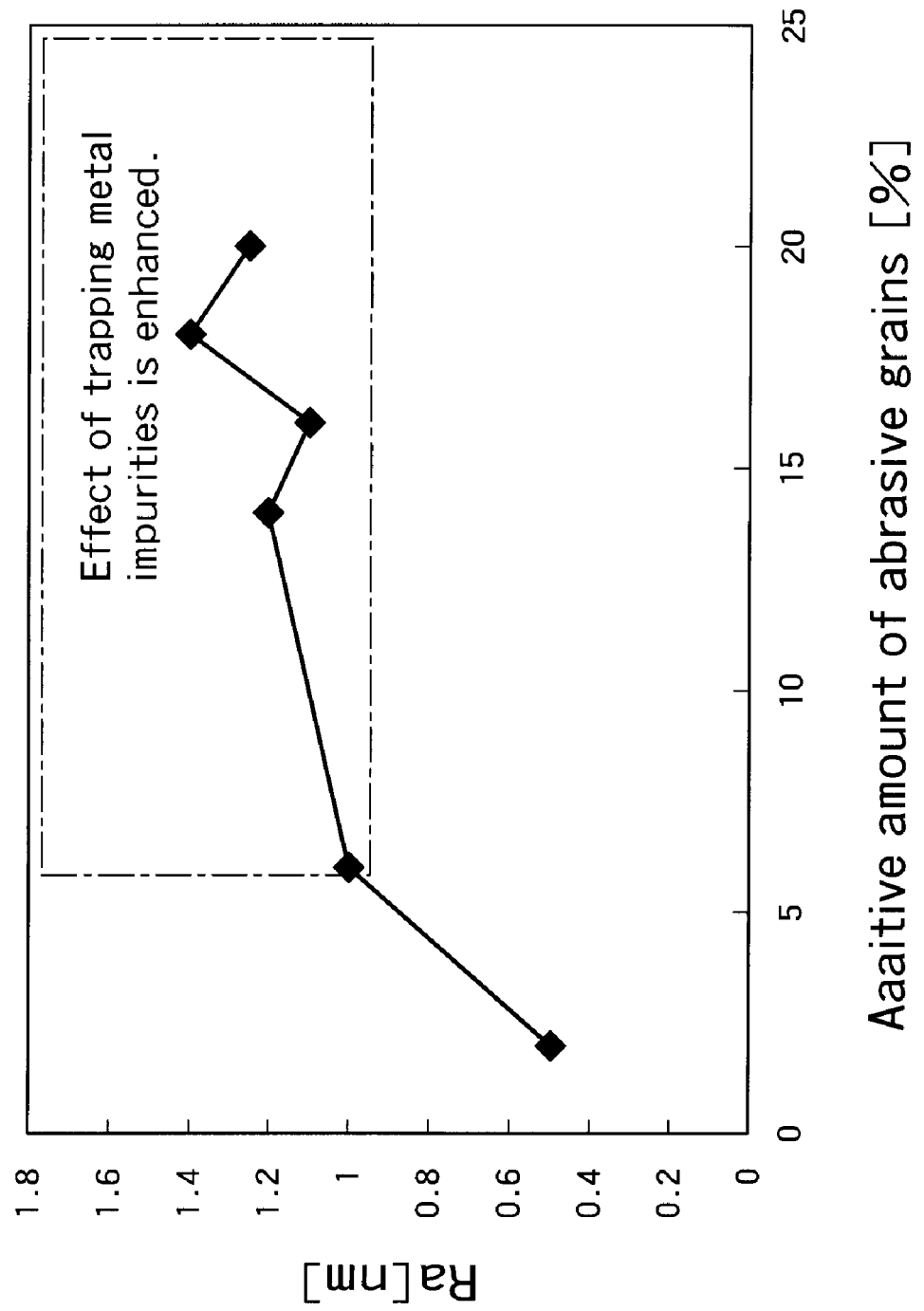
FIG. 3 is a view illustrating an average roughness (Ra) of a surface of a silicon powder when surface roughening is performed changing the additive amount of abrasive grains.

The surface of the silicon powder is preferably subjected to surface roughening for the sake of the formation of many dangling-bonds, for use in the trapping of metal impurities, on the surface. For example, surface roughening is subjected to the surface of the silicon powder using abrasive grains so that the surface of the silicon powder is rough, whereby the effect of trapping of the metal impurity ions in the silicon powder can be enhanced. FIG. 3 illustrates an average roughness (Ra) of a surface of a silicon powder when the surface roughening is performed while changing the additive amount of abrasive grains. As illustrated in FIG. 3, the surface roughening is performed using the abrasive grains contained in an amount of not less than 6%, whereby Ra of not less than 1.0 nm can be realized. When Ra is not less than 1.0 nm, it has been confirmed that the deterioration of the electrical characteristics of a semiconductor device can be effectively suppressed. It is considered that this is because when Ra is not less than 1.0 nm, there could be provided enough gettering sites (dangling bonds) to trap the metal impurity ions adversely affecting the electrical characteristics of a semiconductor device.

(Adhesive Sheet)

The adhesive sheet was described.

The adhesive sheet is included in a semiconductor package of a semiconductor device and used for adhering semiconductor chips overlapped with each other or a semiconductor chip and a substrate for a semiconductor package. The adhesive sheet is referred to as DAF, as described above.

The adhesive sheet (DAF) in accordance with an embodiment of the present invention is an adhesive sheet mainly composed of a resin, such as an epoxy resin, generally used in adhesion of a semiconductor chip and so on.

In accordance with an embodiment of the present invention, the adhesive sheet contains at least one metal impurity ion trapping agent as described above, and while the adhesive sheet traps metal impurity ions, the semiconductor chips or the semiconductor chip and the substrate for a semiconductor package are adhered with the adhesive sheet. The adhesive sheet has a thickness of, for example, not more than 50 µm.

The metal impurity ion trapping agent is contained in the adhesive sheet in an amount of not more than 20 vol. %, preferably not more than 10 vol. % to a resin mainly constituting the adhesive sheet, for example.

The reasons why the amount of the metal impurity ion trapping agent contained in the adhesive sheet is limited are as follows.

When a large amount of the metal impurity ion trapping agent is contained in the adhesive sheet, the metal impurity ion trapping agents may be connected in the adhesive sheet to be electrically continuity, and such a consequence should be avoided. Moreover, the amount of the metal impurity ion trapping agent is limited so that the metal impurity ions are trapped, and, at the same time, the inherent adhesive strength and elastic modulus of the adhesive sheet are not deteriorated.

(Semiconductor Device)

The semiconductor device in accordance with an embodiment of the present invention was described. As an example of the semiconductor device in accordance with an embodiment of the present invention, a memory semiconductor device was described. However, the present invention is not limited to the memory semiconductor device, but it is also applicable to other semiconductor devices.

FIG. 1 is a cross-sectional view of a memory semiconductor device 1 according to an embodiment of the present invention, comprising a semiconductor package having a plurality of semiconductor chips built in. The memory semiconductor device 1 in accordance with an embodiment of the present invention will be described using FIG. 1.

As illustrated in FIG. 1, the memory semiconductor device 1 according to an embodiment of the present invention comprises a semiconductor package 2. The semiconductor package 2 includes a plurality of semiconductor chips 4 stacked on a substrate 3 for a semiconductor package. Each back surface of the semiconductor chips 4 is, as described above, subjected to mirror polishing (for example, dry polishing) so that a good deflecting strength can be ensured even if the thickness of the semiconductor chip 4 is reduced. In other words, the back surfaces of the semiconductor chips 4 have been subjected to mirror polishing, and consequently, they do not have a gettering site for use in the trapping of metal impurity ions. The thickness of the semiconductor chips 4 is not more than 100 µm, for example.

The semiconductor package 2 further comprises adhesive sheets (DAF) 5. Each of the adhesive sheets 5 is held between the semiconductor chips 4 overlapped with each other in order to adhere the semiconductor chips 4 to each other. In order to adhere the substrate 3 for a semiconductor package to the semiconductor chip 4, the adhesive sheet 5 is also held between the substrate 3 and the semiconductor chip 4 arranged at the lowermost layer of the semiconductor chips 4 stacked on the substrate 3. The thickness of the adhesive sheet 5 is not more than 50 μm, for example.

In order to trap metal impurity ions, the adhesive sheet 5 contains at least one metal impurity ion trapping agent as described above. As described above, the metal impurity ion trapping agent is contained in the adhesive sheet 5 in an amount of not more than 20 vol. %, preferably not more than 10 vol. % to a resin mainly constituting the adhesive sheet 5. As described above, the amount of the metal impurity ion trapping agent contained in the adhesive sheet 5 is limited, whereby the metal impurity ion trapping agents are prevented from being connected in the adhesive sheet 5 to be electrically continuity, and, at the same time, the adhesive strength and elastic modulus of the adhesive sheet 5 are not deteriorated.

As seen in FIG. 1, an electrode pad formed on each of the semiconductor chips 4 is electrically connected to an electrode pad, arranged on the substrate 3 for a semiconductor package, through each wire 6. The electrode pad of the substrate 3 is electrically connected to other devices provided outside the semiconductor device 1.

The stacked semiconductor chips 4 and the substrate 3 for a semiconductor package are covered with a mold 7 formed of a resin, whereby they are protected.

Even when the back surface of the semiconductor chip 4 is subjected to mirror polishing, the semiconductor device 1 comprises the above-described adhesive sheet (DAF) 5 containing the metal impurity ion trapping agent, whereby while the characteristics of the semiconductor device 1 can be prevented from being deteriorated by metal impurity ions, the semiconductor device 1 can be shrunk in size.

It is to be noted that the present invention is not limited to the above-described embodiment and can be implemented in various modified forms without departing from the scope of the present invention.

The invention claimed is:

1. A semiconductor device comprising:
   a substrate;
   a first semiconductor chip on the substrate;
   a second semiconductor chip on the first semiconductor chip, the second semiconductor having a mirrored back surface; and
   an adhesive sheet between the first semiconductor chip and the second semiconductor chip, the adhesive sheet containing metal impurity ion trapping agent,
   wherein the metal impurity ion trapping agent comprises a silicon powder, an average of surface roughness of the silicon powder being not less than 1.0 nm.

2. The semiconductor device according to claim 1, wherein the silicon powder comprises at least one of an amorphous silicon and a polycrystalline silicon.

3. The semiconductor device according to claim 1, wherein the metal impurity ion comprises at least one of ions of Cu, Fe, Au, Na, Ni, Co, Ti, and Ta.

4. The semiconductor device according to claim 1, wherein the mirrored back surface is formed by dry polishing.

5. An adhesive sheet, which is between a first semiconductor chip in a semiconductor device and a second semiconductor chip on the first semiconductor chip, comprising a metal impurity ion trapping agent,
   wherein the metal impurity ion trapping agent comprises a silicon powder, an average of surface roughness of the silicon powder being not less than 1.0 nm.

6. The adhesive sheet according to claim 5 it wherein the silicon powder comprises at least one of an amorphous silicon and a polycrystalline silicon.

7. The adhesive sheet according to claim 5, wherein the metal impurity ion comprises at least one of ions of Cu, Fe, Au, Na, Ni, Co, Ti, and Ta.

8. The adhesive sheet according to claim 5, further comprising an epoxy resin.

* * * * *